MAKING A WELDED CIRCUIT ASSEMBLY

Filed Aug. 11, 1964

INVENTOR.
James H. Flaherty
BY
Warren D. Hill
ATTORNEY

MAKING A WELDED CIRCUIT ASSEMBLY

Filed Aug. 11, 1964

INVENTOR.
James H. Flaherty
BY
Warren D. Hill
ATTORNEY

United States Patent Office 3,430,338

Patented Mar. 4, 1969

3,430,338

MAKING A WELDED CIRCUIT ASSEMBLY

James H. Flaherty, Hales Corners, Wis., assignor to General Motors Corporation, Detroit, Mich., a corporation of Delaware Filed Aug. 11, 1964, Ser. No. 388,860

U.S. Cl. 29—626 4 Claims

Int. Cl. H05k 3/30

ABSTRACT OF THE DISCLOSURE

Terminal studs are welded to a nickel sheet and then partially encapsulated with epoxy to form a support for the sheet. Circuit paths are formed by etching the sheet and components are welded to the studs.

This invention relates to printed circuits and more particularly to printed circuits with terminals welded thereto and to the process for making such circuits.

In making high density electronic modules where highly reliable welded joints are required, it has been the practice to assemble circuit components with their leads extending parallel to each other and extending through suitable apertures in a pair of spaced parallel insulating wafers to form a sandwich construction commonly referred to as cordwood packaging. Conductive connections are made between the various component leads by routing nickel ribbons in a maze-like pattern adjacent the lead ends which extend through the insulating boards and welding the ribbons to the lead ends. That method of making modules has found wide use in aerospace applications and has proved to meet the high requirements of reliability of those applications and has been found to be much superior in this respect than the older technique of soldering component leads to point-to-point wiring or to printed circuits. This method, however, requires much tedious hand work in routing and attaching the conductive ribbons to the leads.

Another method of forming welded connections in cordwood packages of electronic components involves the use of printed circuit boards with outwardly turned terminal tabs adjacent the component leads to permit welding of the leads directly to the printed circuit conductors. This type of construction is described in my copending application Ser. No. 49,028, filed Aug. 11, 1960 now Patent No. 3,157,828. In that method, however, difficulty may be experienced in forming the printed circuit conductors with the outwardly turned tabs.

The present invention is intended to take advantage of the feature of cordwood packaging and at the same time to minimize the amount of hand work required to make the circuit connections, to provide a method which is well suited to be performed by automatic machinery and to provide an improved article permitting high density packaging. Another principal purpose, however, of the present invention is that no elaborate tool change is required to produce several different circuit configurations by the same automatic equipment.

A further purpose of the invention is to provide a circuit board which permits ease of assembly to circuit components and which results in highly reliable electrical connections.

The above and other advantages will be made more apparent from the following specification taken in conjunction with the accompanying drawings wherein like reference numerals refer to like parts and wherein:

FIGURE 6 is a plan view taken on line 6—6 of

Figure 5:
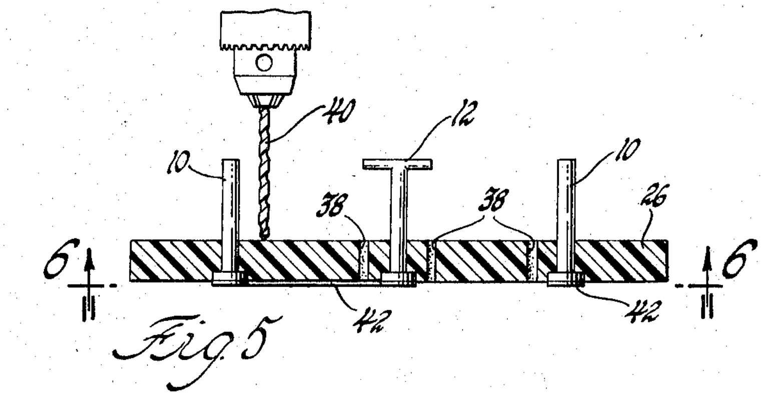
Figure 7:
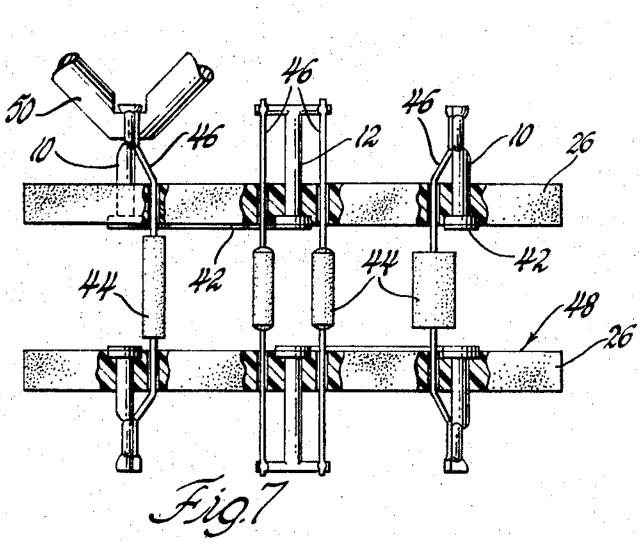
Figure 8:
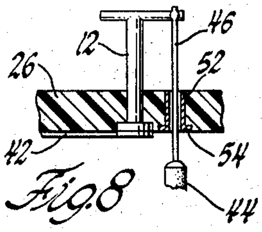
Figure 9:
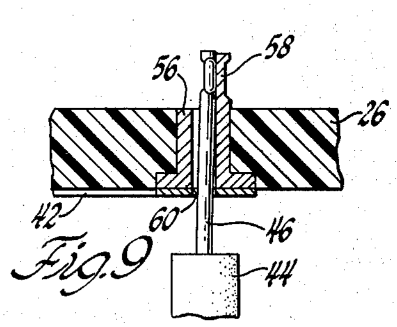
Figure 10:
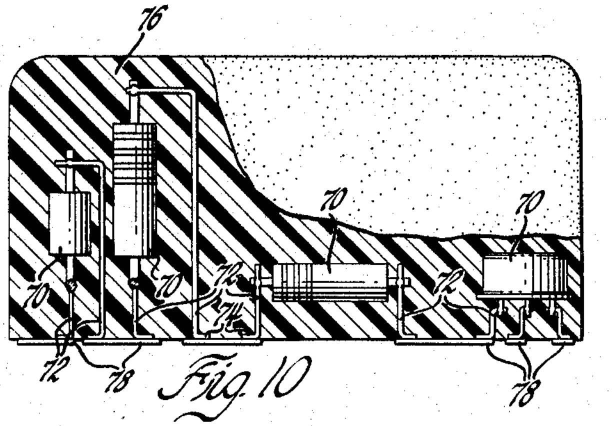

FIGURE 5 of a printed circuit board according to my invention;

FIGURE 7 is a partly broken away elevational view of a printed circuit assembly according to my invention and including an illustration of a welding step;

FIGURE 8 is a cross-sectional elevational view of another embodiment of my invention;

FIGURE 9 is a cross-sectional elevational view of still another embodiment of my invention; and FIGURE 10 is a cross-sectional elevational view of an additional embodiment of my invention.

Figure 1:
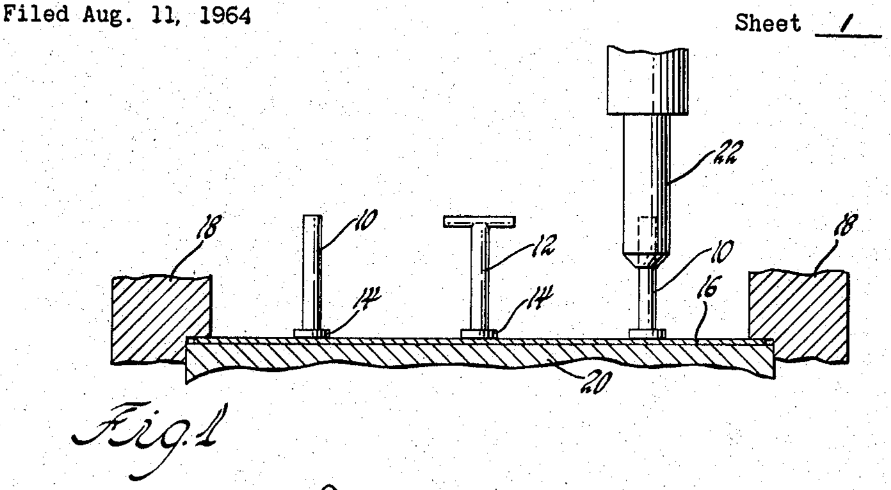
FIGURES 1 through 5 are cross-sectional elevational views illustrating the several steps in the manufacture of a printed circuit assembly according to my invention.

The process according to the principal embodiment of my invention contemplates the use of an automatic stud welding machine of a well known type which is controlled by a pretaped program and which thus is able to accurately move to predetermined locations, position a stud against a workpiece at each location, and weld the stud to the workpiece. The studs may be of the configuration shown in the drawings; that is, a simple straight pin 10 or a T-shaped pin 12 with enlarged heads 14 at the lower end thereof or, alternately, they may comprise other pin configurations not shown such as those having Y branches at the upper end thereof. In FIGURE 1, the first step of the process is illustrated. A nickel sheet 16 approximately 0.010 inch thick is held around its periphery by grounded electrode clamps 18 against a backing plate 20, and nickel studs 10, 12 which eventually will become terminal connectors for the circuit conductors are welded to the upper surface of the nickel sheet 16 at predetermined locations by the tape controlled stud welding machine of which only the electrode tip 22 is shown. While nickel or nickel alloy studs and base sheet are preferred, the invention is in no way limited to these materials, it being obvious that other suitable materials may be used.

Figure 2:
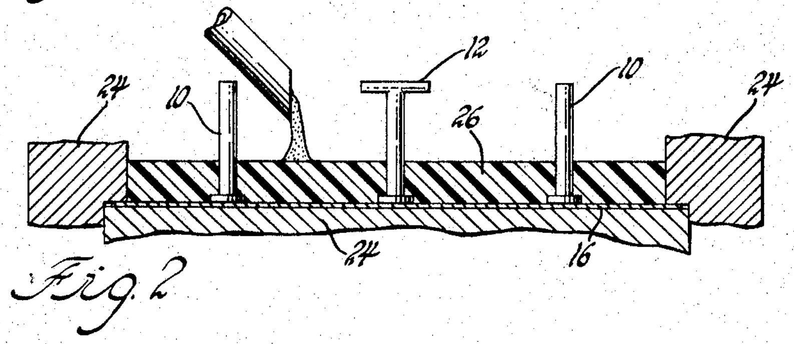

After studs corresponding to every desired terminal connection have been welded to the base sheet 16, the electrode clamps 18 are removed from the base sheet and the studded assembly is then fitted in a mold 24 as shown in FIGURE 2. A potting compound 26, preferably liquid epoxy, is poured over the top surface of the base sheet 16 to form a permanent support for the studs 10, 12 and the circuit pattern which will be formed from the base sheet 16. The potting compound 26 when cured forms the insulating base of the circuit board and covers the stud head 14 and a portion of the shank to strengthen and add rigidity to the welded connection.

Figure 3:
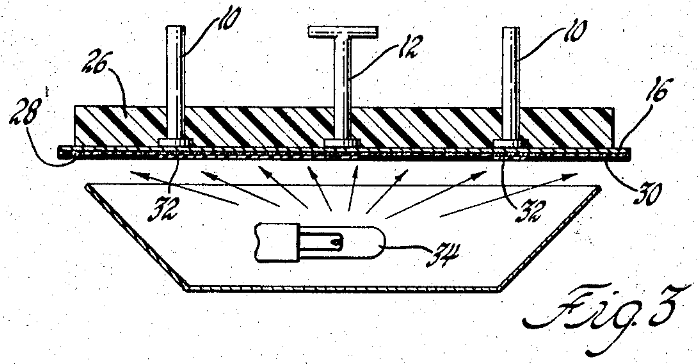
Figure 4:
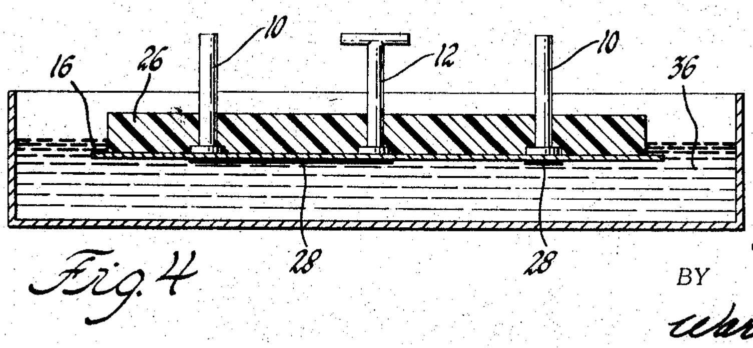

Next the desired circuit pattern is formed from the base sheet by selectively removing portions of the base sheet. This may be performed by any of the several well known methods for making printed circuits but the photo-etching method is preferred. To that end the bottom surface of the nickel sheet 16 is coated with photoresist 28. As shown in FIGURE 3, a photographic transparency 30 bearing a positive representation of the desired circuit pattern, as indicated by portions 32, is placed against the layer of resist coating 28 and the photoresist material is exposed to actinic radiation from a suitable light source 34. Care must be taken to register the photographic transparency 30 with the nickel sheet 16 so that the studs 10, 12 will be in line with those portions of the resulting circuit pattern with which terminal connections are desired. Then the exposed photoresist coating 28 is developed and the assembly is partially immersed in an acid bath 36, FIGURE 4, wherein the unprotected portions of the nickel sheet 16 are etched away. The epoxy layer 26, of course, protects the upper surface of the nickel sheet 16 from the acid.

Figure 6:
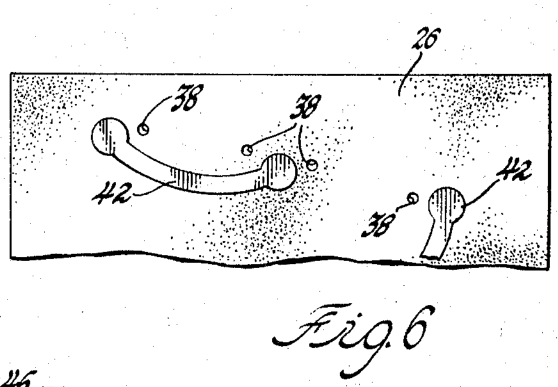

As depicted in FIGURE 5, holes 38 are drilled adjacent each stud 10, 12 by a drill 40 to permit the insertion of component leads therethrough. Preferably the holes are drilled by a tape controlled machine which is similar in operation to the stud welding machine in that preprogrammed tapes direct the machine to drill holes in predetermined locations. FIGURE 6 illustrates typical circuit paths 4 2on the bottom of the etched and drilled assembly. The circuit board is now completed and is ready for assembly with electrical components 44, FIGURE 7. Component leads 46 are inserted from the lower side of the board through the apertures provided therefor and then a similar board 48, but with a different circuit pattern thereon, is assembled to the other end of the component leads. Finally, each component lead 46 is welded to its neighboring stud 10, 12 by a welding machine, only the electrodes 50 being shown. As is apparent from FIGURE 7, the force of the welding electrodes will bend the studs 10 and leads 46 to eliminate the space between the stud and the lead which space is caused by the necessity of forming the lead aperture at a point which will avoid piercing the enlarged land of the circuit or the stud head 14. The layer of epoxy 26 which forms the mechanical support for the entire assembly holds the shank of each stud 10, 12 rigid with respect to its welded connection with the circuit conductor and avoids stressing the butt weld when the stud is being bent by the electrodes 50. Similarly the epoxy 26 prevents undue stresses on the components 44 when leads 46 are bent. Where the T-shaped studs 12 are used, no substantial space is required between leads 46 and studs 12 and no appreciable bending is necessary.

It will thus be seen that my method minimizes the amount of hand labor required to produce such a circuit, detailed hand work being required only for the steps of assembling the components to the circuit boards and making the individual welded connections between the studs and leads, although this final step may also be performed by a preprogrammed tape controlled welding machine.

An alternative way of forming lead holes through the circuit board which eliminates the drilling operation shown in FIGURE 5 is to weld small tubes 52 with enlarged lower ends 54 at desired locations to the base sheet 16 before the epoxy is applied thereto. When the base sheet is partially removed during the etching process, both ends of the tube 52 will be exposed thereby forming an aperture through the epoxy board 26. Where the tube 52 consists of material not attacked by the etching acid, the entire tube will remain intact. If, however, the tube 52 and base sheet 16 are both of the same material, then the tube will be partially or wholly removed by the acid. In either case a suitable lead hole is formed. FIGURE 8 illustrates a portion of a circuit panel formed in this manner where the tube 52 is intact.

FIGURE 9 shows another version of a circuit board made by the same basic process but which allows the lead holes to be formed in the board without the requirement of a separate step in the manufacture of the board. In this case a tubular terminal stud 56 is used. The stud has an upwardly extending finger portion 58 for welding to the component lead 46. The method of fabricating a board with tubular studs will be the same as that depicted in FIGURES 1 through 4 and described above except that the tubular stud 58 will be used. Since an aperture 60 through the conductor 42 in registry with the axis of the tubular stud must be formed, the transparency must include opaque portions corresponding to each aperture 60 to permit holes to be etched through the base sheet. To assemble components to the circuit board, the component leads 46 are threaded through the tubular studs 56 and welds are made between the leads 46 and the fingers 58 of the studs.

It will further be seen that the process is very flexible and that, in order to rapidly adapt the equipment to produce a different circuit, it is necessary only to change the programming tapes in the tape controlled stud welding machine and in the tape controlled drilling machine as well as to use a different photographic transparency during the step of exposing the photoresist to actinic radiation. The articles produced by my process may be designed to permit high density packaging since very thin circuit paths can be used. The epoxy supporting layer not only provides strong mechanical support between the studs and circuit conductors but also has excellent dielectric qualities. Most importantly, however, the articles are superior to those previously known because they permit easily making reliable welding connections during the final assembly of the electronic module.

Another major embodiment of my invention, as illustrated in FIGURE 10, has the advantage of eliminating one of the two printed circuit boards usually required in cordwood packaging to thereby provide a lighter and more compact module, and further avoiding the necessity of providing apertures through the circuit board for component leads and eliminating the step of welding component leads to terminal studs after the circuit board is formed. This embodiment of my invention is carried out by providing each component 70 with auxiliary leads 72 formed in such a manner that all leads from each component extend in the same direction thereby permitting both leads to be attached to the same circuit board. This concept is disclosed in my U.S. Patent No. 3,275,895. For the present application, however, the auxiliary leads 72 terminate in a foot-shaped terminal portion 74 which can be readily welded to the base sheet to thereby provide welded terminal connections. The components 70, after having the auxiliary leads or terminals 72 affixed thereto, are welded to the base sheet (shown only in part as the resultant circuit pathways 78) preferably by automatic equipment, as discussed above, and epoxy potting compound 76 is cast onto the same side of the sheet to which the components 70 are attached to wholly encapsulate the components 70. The circuit assembly is then completed by forming a pattern of etch resist material on the exposed face of the metal sheet and finally etching away the unprotected portions of the sheet to define the circuit pathways 78. Alternatively, a relatively thin layer of epoxy material like that of FIGURES 2 through 9 is used to add rigidity to the terminal connections and to protect the base sheet from the etchant. However, since it is quite common to completely encapsulate electronic assemblies in potting compounds, the epoxy 76 is preferably molded entirely around the components, as shown in FIGURE 10, so that an additional encapsulation step is not required.

The article of FIGURE 10 and the process for making it clearly offer advantages not incorporated in prior art electronic modules or processes for making them. The module is very light and compact because only one set of circuit pathways is used, yet it utilizes the cordwood packaging concept, if desired. Also, the unsurpassed reliability of welded circuit connections is present. The method of making the module is exceptionally simple and requires fewer steps than required in making other modules of comparable function.

It is to be understood that this description is illustrative of the preferred embodiments and the scope of the invention is intended to be limited only by the following claims.

I claim:

1. A method of making printed circuits comprising welding terminal studs to one side of a metal sheet, casting a layer of hardenable resinous material over said one side of the sheet, hardening the resinous material, applying a coating of photoresist material to the other side of the sheet, exposing the coating to actinic radiation through a transparency of the desired circuit pattern, the circuit pattern selectively overlying the terminal studs, developing the coating to define protected and unprotected portions of the sheet, completely etching away the unprotected portions of the sheet, and forming an aperture adjacent each stud through the insulating material for inserting component leads therethrough.

2. A method of making a printed circuit assembly comprising welding terminal studs to one side of a metal sheet, casting a layer of hardenable resinous material over said one side of the sheet, hardening the resinous material, exposing the coating to actinic radiation to the other side of the sheet, exposing the coating to actinic radiation through a positive transparency of the desired circuit pattern, the circuit pattern selectively overlying the terminal studs, developing the coating to define protected and unprotected portions of the sheet, completely etching away the unprotected portions of the sheet in an acid bath, forming an aperture adjacent each stud through the insulating material, inserting component leads therethrough, and welding the component leads to the studs.

3. A method of making a printed circuit assembly comprising welding terminal portions onto component leads, welding the terminal portions of said leads in prearranged locations to one side of a single metal sheet, casting a layer of epoxy material substantially completely over the one side of the sheet to encapsulate the welded terminal portions and the components, hardening the epoxy material to support the sheet and terminal portions, forming a pattern corresponding to the desired circuit pathways and overlaying the welded terminal portions in etch resist material on the other side of the sheet, and completely etching away the portions of the sheet not protected by etch resist material in an acid bath.

4. A method of making a printed circuit assembly comprising forming terminal portions on component leads, welding the terminal portions of said leads in prearranged locations to one side of a metal sheet, forming a layer of insulating material substantially completely over the one side of the sheet to encapsulate the welded terminal portions, forming a pattern corresponding to the desired circuit pathways in etch resist material on the other side of the sheet with said pathways overlying the welded terminal portions, and complete etching away the portions of the sheet not protected by etch resist material.

References Cited

UNITED STATES PATENTS

| | | | |
|---|---|---|---|
| 3,079,674 | 3/1963 | Shortt | 29—155.5 |
| 3,098,287 | 7/1963 | Buschbaum | 29—155.5 |
| 3,065,383 | 11/1962 | Guillemot | 317—101 |
| 3,191,100 | 6/1965 | Sorvillo | 317—101 |
| 2,638,660 | 5/1953 | Van Gessel | 29—25.15 |
| 3,142,783 | 7/1964 | Warren | 29—155.5 |
| 3,216,089 | 11/1965 | Dettman | 29—155.55 |
| 3,266,125 | 8/1966 | Tobolski | 29—155.5 |
| 3,319,319 | 5/1967 | Oswald | 29—155.5 |

JOHN F. CAMPBELL, *Primary Examiner.*

ROBERT W. CHURCH, *Assistant Examiner.*

U.S. Cl. X.R.

29—529, 597; 174—68.5; 219—99; 264—272